United States Patent [19]

Fritz

[11] Patent Number: 5,089,686
[45] Date of Patent: Feb. 18, 1992

[54] ELECTRON BEAM GENERATOR FOR AN ELECTRON BEAM GUN

[75] Inventor: Dieter Fritz, Gelnhausen, Fed. Rep. of Germany

[73] Assignee: PTR Präzisionstechnik GmbH, Maintal/Dörnigheim, Fed. Rep. of Germany

[21] Appl. No.: 579,794

[22] Filed: Sep. 10, 1990

[30] Foreign Application Priority Data

Sep. 9, 1989 [DE] Fed. Rep. of Germany ....... 3930202

[51] Int. Cl.$^5$ .................................. B23K 15/00
[52] U.S. Cl. ................................. 219/121.27
[58] Field of Search ............ 219/121.26, 121.27, 219/121.28, 121.25, 121.12, 121.13

[56] References Cited

U.S. PATENT DOCUMENTS 4,097,714  6/1978  Shergov et al. .......... 219/121.27

Primary Examiner—C. L. Albritton
Attorney, Agent, or Firm—Felfe & Lynch

[57] ABSTRACT

In the electron beam generator the cathode (3) the control electrode (4) and the anode (5) are provided with easily replaceable parts (12, 13, 14, 28, 29) so as to be able, by exchanging the parts, to optimize the electron beam generator in a simple manner for a selected power range within the working range of the electron beam gun.

10 Claims, 1 Drawing Sheet

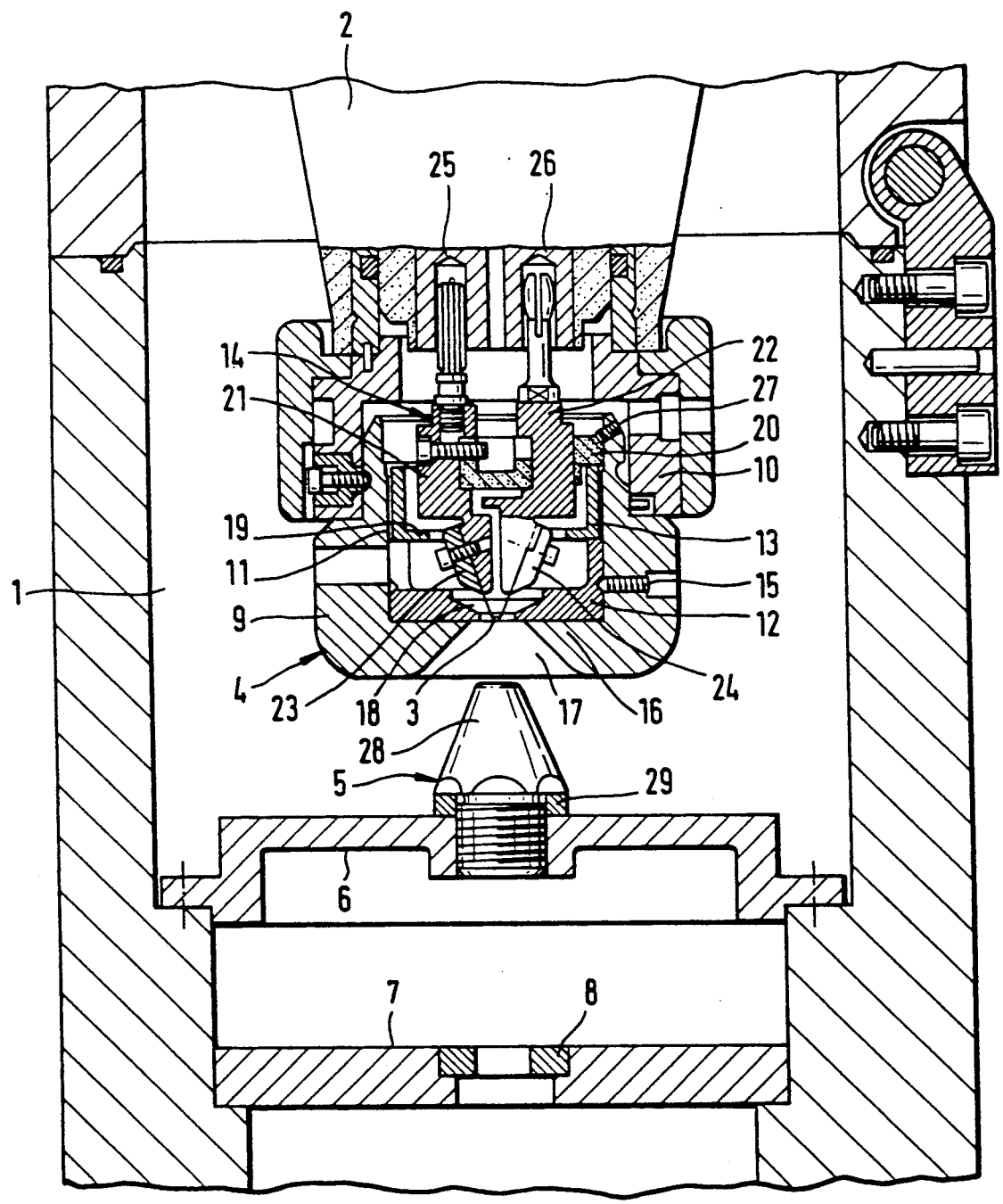

ELECTRON BEAM GENERATOR FOR AN ELECTRON BEAM GUN

BACKGROUND OF THE INVENTION

The invention relates to an electron beam generator for an electron beam gun, having a cathode, a control electrode and an anode which are disposed in an evacuable acceleration chamber.

Electron beam generators of the stated kind are used in metallurgy. They generate an electron beam which, being focused by an electromagnetic focusing system, is directed against a workpiece for the purpose, for example, of removing material therefrom, or of melting it. The need in this case arises for adapting its power to various working procedures and materials, for example by varying the accelerating voltage and the beam current. It has been found, however, that the known electron beam generators can be operated in an optimum manner only within a narrow range of power. This optimum power range is defined by the emittance—the product of the focus radius times the solid angle—which varies with the beam current. To make optimum use of the entire working range of an electron beam gun it has therefore been necessary to replace the gun from one case to the next.

SUMMARY OF THE INVENTION

The invention is addressed to creating an electron beam generator of the kind described above, which can be adapted by simple means to the selected power range within the range of operation of the electron beam gun.

The cathode, the control electrode and the anode have easily interchangeable parts which contribute by their shape and size to the formation of the electron beam. An assortment of different parts is provided for the cathode, the control electrode and the anode, these parts being interchangeable.

By the installation of the interchangeable parts provided for the power desired in each case, the invention permits optimum beam formation. In this manner the quality of the beam is substantially improved throughout the power range. In the case of production equipment, the electron beam generator can be optimized for a specific use and it becomes easier to achieve repeatable results. The interchangeable parts can be manufactured at reasonable cost and can therefore be kept on hand in sufficiently fine gradations of size and shape.

In a further development of the invention, provision can be made for optimizing the external shape of the electron beam generator electrodes, which cannot be varied by interchangeable parts, to achieve minimum field strength. This version results in great reliability of operation and enables the electron beam generator to be adapted to all applications by varying the parts which are interchangeable.

The control electrode preferably consists of a pot-shaped, hollow cylindrical jacket with a central bore passing through its bottom, into which an annular insert designed as an interchangeable part can be installed to vary the shape of the central bore. Preferably the insert consists of a material of high permeability. Provision can furthermore be made in invention for a cathode holder in the form of an interchangeable part and held by an insulator to be installed as an interchangeable part in the jacket. The anode can advantageously consist, of an interchangeable anode body and an interchangeable anode spacing ring. Furthermore, an annular diaphragm in the form of an interchangeable part can be provided in back of the anode with respect to the direction of the beam.

BRIEF DESCRIPTION OF THE DRAWING

The sole figure is a cross section through an electron beam generator in accordance with the invention.

DETAILED DESCRIPTION OF THE PREFERRED EMBODIMENT

In the electron beam generator in the drawing, a cathode 3 and a control electrode 4 are disposed on a insulator 2 in the center of an evacuable acceleration chamber 1, and can be connected to a high-voltage generator by electrical conductors inside of the insulator 2. At a distance from the cathode 3 is an annular anode 5 which is coaxial therewith and is borne by a plate 6 and is at ground potential with the accelerating chamber 1. A diaphragm 8 is provided in a second plate 7 at a distance from the anode 5.

The control electrode 4 has a pot-shaped, cylindrical jacket 9 whose external shape has been optimized to achieve minimum field strengths. The jacket 9 is borne by a flange 10 on which it is held by a catch for easy release. One over another, in a central, cylindrical bore 11 in the jacket 9, are an insert 12, a supporting ring 13, and a cathode holder 14, which rest on one another and thus have a precise geometrical relationship to one another. The insert 12 is in the shape of a cylindrical pot and is centered by its cylindrical exterior in the bore 11 in the jacket 9. By means of a set screw 15 engaging a groove, the insert 12 is locked in the bore 11, in contact with the bottom 16 of the jacket 9. A central bore 17 flaring conically in the direction of the beam is provided in the bottom 16 for the passage of the electron beam. The central bore 17 is adjoined by an opening 18 in the insert 12, which is smaller in diameter and surrounds the area of emission of the cathode 3. The opening 18 flares conically toward the cathode holder 14. In its diameter and in its shape, the opening 18 is adapted to a cathode size suitable for a certain specific power range. If a cathode of a different size is installed for a different power range, the insert 12 is replaced with one that is adapted to this other cathode.

The supporting ring 13 surrounds the cathode holder 14 and provides for its precise axial positioning with respect to the insert 12 of the control electrode 4. An insulator 20 of the cathode holder 14 is optically shielded from the electron beam by a radially inwardly directed flange 19. The cathode holder 14 has two connecting terminals 21, 22, of a substantially mirror-image configuration, which are held in the insulator 20 and bear at their bottom ends clamps 23, 24, for fastening the two ends of the cathode 3. The terminals 21, 22, are connected to the heater circuit of the electron beam generator by plug contacts 25, 26. Just like the insert 12 and the supporting ring 13, the cathode holder 14 is an interchangeable part which is provided so as to fit different cathode sizes. The cathode holder 14 is fastened in the jacket 9 by a set screw 27.

The anode 5 has a replaceable anode sleeve 28 having a threaded projection which is screwed into a threaded bore in plate 6. The anode sleeve 28 and the anode spacing ring 29 are replaceable parts. To optimize the electron beam for a specific power range, therefore, the appropriate anode sleeve can be selected from a plurality of anode sleeves 28 of various bore diameter and the acceleration length can be optimized with an anode spacing ring 29. Furthermore, diaphragms 8 of different diameters can be inserted into plate 7 in order to achieve the desired beam quality.

To set up the electron beam generator for a specific use, the housing of the accelerating chamber 1 is swung open, making the electrodes easily accessible. To set up the cathode 3 and the control electrode 4, the jacket 9 can be removed from the mounting flange 10 and equipped in the desired size with an insert 12, a supporting ring 13 and a cathode holder 14 with a cathode 4. At the same time the appropriate anode sleeve 28, anode spacing ring 29 and diaphragm 8 can be installed. These measures can be performed simply and quickly and involve no more than a small parts cost. Thus an optimum adaptation of the electron beam generator to the particular application can be accomplished in a simple and inexpensive manner.

I claim:

1. Electron beam generator for an electron beam gun, comprising
    a control electrode comprising a pot-shaped jacket having a cylindrical bore and a bottom with an opening for an electron beam,
    a pot-shaped insert closely received in said cylindrical bore, said inert having a conical opening adapted to a cathode size,
    a supporting ring which is closely received in said cylindrical bore over said pot-shaped insert,
    a cathode holder received in said supporting ring,
    a cathode borne by said cathode holder, and
    an anode comprising anode sleeve positioned opposite said cathode and having a bore therethrough for receiving an electron beam generated by said cathode.

2. An electron beam generator as in claim 1 wherein said pot-shaped insert consists of a material of high permeability.

3. An electron beam generator as in claim 1 further comprising electrical insulation means between said control electrode and said cathode holder.

4. An electron beam generator as in claim 1 wherein said anode further comprises a spacing ring which spaces said anode sleeve relative to said cathode.

5. An electron beam generator as in claim 1 further comprising an annular diaphragm opposite said anode from said cathode for receiving said electron beam therethrough.

6. A kit for an electron beam generator for an electron beam gun comprising
    a control electrode comprising a pot-shaped jacket having a cylindrical bore and a bottom with an opening for an electron beam,
    a plurality of pot-shaped inserts having a like outside diameter for close reception in said cylindrical bore, said inserts each having a different size conical opening for a different size cathode,
    a supporting ring which is closely received in said cylindrical bore over one of said pot-shaped inserts,
    a plurality of cathode holders having a like external shape for reception in said supporting ring but configured to carry different size cathode,
    a plurality of different size cathodes having different power ranges, one of said cathodes being borne by one of said cathode holders, and
    a plurality of different anodes such comprising a sleeve of like external shape but having a bore therethrough of a different diameter.

7. A kit as in claim 6 wherein said pot-shaped inserts consists of a material of high permeability.

8. A kit as in claim 6 further comprising electrical insulation means between said control electrode and said cathode holder.

9. A kit as in claim 6 further comprising a plurality of spacing rings for adjusting the spacing of said anode sleeve relative to said cathode.

10. A kit as in claim 6 further comprising a plurality of annular diaphragm each having a like outside diameter and a different inside diameter, one of said diaphragm being situated opposite said anode from said cathode for receiving said electron beam therethrough.

* * * * *

UNITED STATES PATENT AND TRADEMARK OFFICE
CERTIFICATE OF CORRECTION

PATENT NO. : 5,089,686

DATED : February 18, 1992

INVENTOR(S) : Dieter Fritz

It is certified that error appears in the above-identified patent and that said Letters Patent is hereby corrected as shown below:

Column 1, line 63, delete "in invention".

Column 2, line 37, "!8" should be --18--;
         line 38, "!2" should be --12--.
         line 39, "!8" should be -- 18--.
Column 3, line 11, "!4" should be --14--.

Signed and Sealed this

Seventh Day of September, 1993

Attest:

BRUCE LEHMAN

*Attesting Officer*      *Commissioner of Patents and Trademarks*